(12) United States Patent
Dalal et al.

(10) Patent No.: US 9,899,330 B2
(45) Date of Patent: Feb. 20, 2018

(54) FLEXIBLE ELECTRONIC CIRCUITS WITH EMBEDDED INTEGRATED CIRCUIT DIE

(71) Applicant: MC10, Inc., Lexington, MA (US)

(72) Inventors: Mitul Dalal, South Grafton, MA (US); Sanjay Gupta, Bedford, MA (US)

(73) Assignee: MC10, INC., Lexington, MA (US)

( * ) Notice: Subject to any disclaimer, the term of this patent is extended or adjusted under 35 U.S.C. 154(b) by 0 days.

(21) Appl. No.: 14/870,719

(22) Filed: Sep. 30, 2015

(65) Prior Publication Data
US 2016/0099214 A1 Apr. 7, 2016

Related U.S. Application Data

(60) Provisional application No. 62/059,478, filed on Oct. 3, 2014.

(51) Int. Cl.
H01L 23/29 (2006.01)
H01L 23/31 (2006.01)
(Continued)

(52) U.S. Cl.
CPC ...... *H01L 23/5389* (2013.01); *H01L 21/2885* (2013.01); *H01L 21/486* (2013.01);
(Continued)

(58) Field of Classification Search
CPC ............... H01L 23/5389; H01L 23/293; H01L 23/3107; H01L 23/42; H01L 23/481;
(Continued)

(56) References Cited

U.S. PATENT DOCUMENTS 3,716,861 A 2/1973 Root
3,805,427 A 4/1974 Epstein
(Continued)

FOREIGN PATENT DOCUMENTS

EP 0585670 A2 3/1994
EP 2259062 A2 12/2010
(Continued)

OTHER PUBLICATIONS

Carvalhal et al., "Electrochemical Detection in a Paper-Based Separation Device", Analytical Chemistry, vol. 82, No. 3, (1162-1165) (4 pages) (Jan. 7, 2010).
(Continued)

*Primary Examiner* — Ida M Soward
(74) *Attorney, Agent, or Firm* — Nixon Peabody LLP

(57) ABSTRACT

Flexible integrated circuit (IC) modules, flexible IC devices, and methods of making and using flexible IC modules are presented herein. A flexible integrated circuit module is disclosed which includes a flexible substrate and a semiconductor die attached to the flexible substrate. An encapsulating layer, which is attached to the flexible substrate, includes a thermoplastic resin and/or a polyimide adhesive encasing therein the semiconductor die. The encapsulating layer may be an acrylic-based thermally conductive and electrically isolating polyimide adhesive. Optionally, the encapsulating layer may be a B-stage FR-4 glass-reinforced epoxy thermoplastic polymer or copolymer or blend. The die may be embedded between two flexible substrates, each of which includes a layer of flexible polymer, such as a polyimide sheet, with two layers of conductive material, such as copper cladding, disposed on opposing sides of the layer of flexible polymer.

24 Claims, 3 Drawing Sheets

(51) Int. Cl.
  *H01L 23/42* (2006.01)
  *H01L 23/48* (2006.01)
  *H01L 23/49* (2006.01)
  *H01L 23/538* (2006.01)
  *H01L 21/288* (2006.01)
  *H01L 21/48* (2006.01)
  *H01L 21/56* (2006.01)
  *H01L 23/498* (2006.01)
  *H01L 23/00* (2006.01)

(52) U.S. Cl.
  CPC ............ *H01L 21/56* (2013.01); *H01L 23/293* (2013.01); *H01L 23/3107* (2013.01); *H01L 23/3121* (2013.01); *H01L 23/42* (2013.01); *H01L 23/481* (2013.01); *H01L 23/49866* (2013.01); *H01L 23/5385* (2013.01); *H01L 23/5387* (2013.01); *H01L 24/83* (2013.01); *H01L 23/5384* (2013.01); *H01L 2224/8385* (2013.01); *H01L 2924/0635* (2013.01); *H01L 2924/07025* (2013.01)

(58) Field of Classification Search
  CPC ............ H01L 23/49866; H01L 23/5384; H01L 23/5385; H01L 23/5387; H01L 24/83
  See application file for complete search history.

(56) References Cited

U.S. PATENT DOCUMENTS

| | | | |
|---|---|---|---|
| 4,304,235 A | 12/1981 | Kaufman | |
| 4,416,288 A | 11/1983 | Freeman | |
| 4,658,153 A | 4/1987 | Brosh | |
| 5,272,375 A | 12/1993 | Belopolsky | |
| 5,306,917 A | 4/1994 | Black | |
| 5,326,521 A | 7/1994 | East | |
| 5,331,966 A | 7/1994 | Bennett | |
| 5,360,987 A | 11/1994 | Shibib | |
| 5,454,270 A | 10/1995 | Brown | |
| 5,491,651 A | 2/1996 | Janic | |
| 5,567,975 A | 10/1996 | Walsh | |
| 5,580,794 A | 12/1996 | Allen | |
| 5,617,870 A | 4/1997 | Hastings | |
| 5,811,790 A | 9/1998 | Endo | |
| 5,817,008 A | 10/1998 | Rafert | |
| 5,907,477 A | 5/1999 | Tuttle | |
| 6,063,046 A | 5/2000 | Allum | |
| 6,282,960 B1 | 9/2001 | Samuels et al. | |
| 6,343,514 B1 | 2/2002 | Smith | |
| 6,387,052 B1 | 5/2002 | Quinn | |
| 6,410,971 B1 | 6/2002 | Otey | |
| 6,421,016 B1 | 7/2002 | Phillips | |
| 6,567,158 B1 | 5/2003 | Falcial | |
| 6,641,860 B1 | 11/2003 | Kaiserman | |
| 6,775,906 B1 | 8/2004 | Silverbrook | |
| 6,784,844 B1 | 8/2004 | Boakes | |
| 6,965,160 B2 | 11/2005 | Cobbley | |
| 6,987,314 B1 | 1/2006 | Yoshida | |
| 7,183,140 B2 * | 2/2007 | Davison | H01L 24/11 257/E21.508 |
| 7,187,060 B2 * | 3/2007 | Usui | H01L 23/49822 257/659 |
| 7,187,072 B2 * | 3/2007 | Fukutomi | H01L 21/4803 257/690 |
| 7,259,030 B2 | 8/2007 | Daniels | |
| 7,265,298 B2 | 9/2007 | Maghribi | |
| 7,302,751 B2 | 12/2007 | Hamburgen | |
| 7,337,012 B2 | 2/2008 | Maghribi | |
| 7,439,614 B2 * | 10/2008 | Inoue | H01L 21/4857 257/700 |
| 7,487,587 B2 | 2/2009 | Vanfleteren | |
| 7,491,892 B2 | 2/2009 | Wagner | |
| 7,521,292 B2 | 4/2009 | Rogers | |
| 7,557,367 B2 | 7/2009 | Rogers | |
| 7,618,260 B2 | 11/2009 | Daniel | |
| 7,622,367 B1 | 11/2009 | Nuzzo | |
| 7,727,228 B2 | 6/2010 | Abboud | |
| 7,739,791 B2 | 6/2010 | Brandenburg | |
| 7,759,167 B2 | 7/2010 | Vanfleteren | |
| 7,960,246 B2 | 6/2011 | Flamand | |
| 7,982,296 B2 | 7/2011 | Nuzzo | |
| 8,097,926 B2 | 1/2012 | De Graff | |
| 8,198,621 B2 | 6/2012 | Rogers | |
| 8,207,473 B2 | 6/2012 | Axisa | |
| 8,217,381 B2 | 7/2012 | Rogers | |
| 8,372,726 B2 | 2/2013 | De Graff | |
| 8,389,862 B2 | 3/2013 | Arora | |
| 8,431,828 B2 | 4/2013 | Vanfleteren | |
| 8,440,546 B2 | 5/2013 | Nuzzo | |
| 8,536,667 B2 | 9/2013 | De Graff | |
| 8,552,299 B2 | 10/2013 | Rogers | |
| 8,664,699 B2 | 3/2014 | Nuzzo | |
| 8,679,888 B2 | 3/2014 | Rogers | |
| 8,729,524 B2 | 5/2014 | Rogers | |
| 8,754,396 B2 | 6/2014 | Rogers | |
| 8,865,489 B2 | 10/2014 | Rogers | |
| 8,886,334 B2 | 11/2014 | Ghaffari | |
| 8,905,772 B2 | 12/2014 | Rogers | |
| 9,012,784 B2 | 4/2015 | Arora | |
| 9,082,025 B2 | 7/2015 | Fasten | |
| 9,105,555 B2 | 8/2015 | Rogers | |
| 9,105,782 B2 | 8/2015 | Rogers | |
| 9,119,533 B2 | 9/2015 | Ghaffari | |
| 9,123,614 B2 | 9/2015 | Graff | |
| 9,148,971 B2 * | 9/2015 | Nishimura | H05K 3/284 |
| 9,159,635 B2 | 10/2015 | Elolampi | |
| 9,168,094 B2 | 10/2015 | Lee | |
| 9,171,794 B2 | 10/2015 | Rafferty | |
| 9,186,060 B2 | 11/2015 | De Graff | |
| 9,343,651 B2 * | 5/2016 | Chen | H01L 41/0533 |
| 2001/0012918 A1 | 8/2001 | Swanson | |
| 2001/0021867 A1 | 9/2001 | Kordis | |
| 2002/0026127 A1 | 2/2002 | Balbierz | |
| 2002/0082515 A1 | 6/2002 | Campbell | |
| 2002/0094701 A1 | 7/2002 | Biegelsen | |
| 2002/0113739 A1 | 8/2002 | Howard | |
| 2002/0128700 A1 | 9/2002 | Cross, Jr. | |
| 2002/0145467 A1 | 10/2002 | Minch | |
| 2002/0151934 A1 | 10/2002 | Levine | |
| 2002/0158330 A1 | 10/2002 | Moon | |
| 2003/0017848 A1 | 1/2003 | Engstrom | |
| 2003/0045025 A1 | 3/2003 | Coyle | |
| 2003/0097165 A1 | 5/2003 | Krulevitch | |
| 2003/0120271 A1 | 6/2003 | Burnside | |
| 2003/0162507 A1 | 8/2003 | Vatt | |
| 2003/0214408 A1 | 11/2003 | Grajales | |
| 2003/0236455 A1 | 12/2003 | Swanson | |
| 2004/0006264 A1 | 1/2004 | Mojarradi | |
| 2004/0085469 A1 | 5/2004 | Johnson | |
| 2004/0092806 A1 | 5/2004 | Sagon | |
| 2004/0106229 A1 * | 6/2004 | Jiang | H01L 23/3128 438/106 |
| 2004/0106334 A1 | 6/2004 | Suzuki | |
| 2004/0135094 A1 | 7/2004 | Niigaki | |
| 2004/0138558 A1 | 7/2004 | Dunki-Jacobs | |
| 2004/0140547 A1 * | 7/2004 | Yamazaki | H01L 21/6835 257/686 |
| 2004/0149921 A1 | 8/2004 | Smyk | |
| 2004/0178466 A1 | 9/2004 | Merrill | |
| 2004/0192082 A1 | 9/2004 | Wagner | |
| 2004/0201134 A1 | 10/2004 | Kawai | |
| 2004/0203486 A1 | 10/2004 | Shepherd | |
| 2004/0221370 A1 | 11/2004 | Hannula | |
| 2004/0243204 A1 | 12/2004 | Maghribi | |
| 2005/0021103 A1 | 1/2005 | DiLorenzo | |
| 2005/0029680 A1 | 2/2005 | Jung | |
| 2005/0067293 A1 | 3/2005 | Naito | |
| 2005/0070778 A1 | 3/2005 | Lackey | |
| 2005/0096513 A1 | 5/2005 | Ozguz | |
| 2005/0113744 A1 | 5/2005 | Donoghue | |
| 2005/0139683 A1 | 6/2005 | Yi | |
| 2005/0171524 A1 | 8/2005 | Stern | |
| 2005/0203366 A1 | 9/2005 | Donoghue | |

(56) References Cited

U.S. PATENT DOCUMENTS

| | | |
|---|---|---|
| 2006/0003709 A1 | 1/2006 | Wood |
| 2006/0038182 A1 | 2/2006 | Rogers |
| 2006/0071349 A1 | 4/2006 | Tokushige |
| 2006/0084394 A1 | 4/2006 | Engstrom |
| 2006/0106321 A1 | 5/2006 | Lewinsky |
| 2006/0128346 A1 | 6/2006 | Yasui |
| 2006/0154398 A1 | 7/2006 | Qing |
| 2006/0160560 A1 | 7/2006 | Josenhans |
| 2006/0248946 A1 | 11/2006 | Howell |
| 2006/0257945 A1 | 11/2006 | Masters |
| 2006/0264767 A1 | 11/2006 | Shennib |
| 2006/0270135 A1 | 11/2006 | Chrysler |
| 2006/0286785 A1 | 12/2006 | Rogers |
| 2007/0027514 A1 | 2/2007 | Gerber |
| 2007/0031283 A1 | 2/2007 | Davis |
| 2007/0108389 A1 | 5/2007 | Makela |
| 2007/0113399 A1 | 5/2007 | Kumar |
| 2007/0123756 A1 | 5/2007 | Kitajima |
| 2007/0270672 A1 | 11/2007 | Hayter |
| 2008/0036097 A1 | 2/2008 | Ito |
| 2008/0046080 A1 | 2/2008 | Vanden Bulcke |
| 2008/0074383 A1 | 3/2008 | Dean |
| 2008/0096620 A1 | 4/2008 | Lee |
| 2008/0139894 A1 | 6/2008 | Szydlo-Moore |
| 2008/0157235 A1 | 7/2008 | Rogers |
| 2008/0193749 A1 | 8/2008 | Thompson |
| 2008/0204021 A1 | 8/2008 | Leussler |
| 2008/0211087 A1 | 9/2008 | Mueller-Hipper |
| 2008/0237840 A1 | 10/2008 | Alcoe |
| 2008/0259576 A1 | 10/2008 | Johnson |
| 2008/0285910 A1* | 11/2008 | Yamada ............. G02B 6/12002 385/14 |
| 2008/0287167 A1 | 11/2008 | Caine |
| 2008/0307644 A1* | 12/2008 | Abbott .................. H05K 3/423 29/852 |
| 2008/0313552 A1 | 12/2008 | Buehler |
| 2009/0000377 A1 | 1/2009 | Shipps |
| 2009/0001550 A1 | 1/2009 | Yonggang |
| 2009/0015560 A1 | 1/2009 | Robinson |
| 2009/0017884 A1 | 1/2009 | Rotschild |
| 2009/0048556 A1 | 2/2009 | Durand |
| 2009/0088750 A1 | 4/2009 | Hushka |
| 2009/0107704 A1 | 4/2009 | Vanfleteren |
| 2009/0154736 A1 | 6/2009 | Lee |
| 2009/0184254 A1 | 7/2009 | Miura |
| 2009/0204168 A1 | 8/2009 | Kallmeyer |
| 2009/0215385 A1 | 8/2009 | Waters |
| 2009/0225751 A1 | 9/2009 | Koenck |
| 2009/0261828 A1 | 10/2009 | Nordmeyer-Massner |
| 2009/0267507 A1* | 10/2009 | Takashima .......... H01L 51/0011 313/511 |
| 2009/0273909 A1 | 11/2009 | Shin |
| 2009/0291508 A1 | 11/2009 | Babu |
| 2009/0294803 A1 | 12/2009 | Nuzzo |
| 2009/0322480 A1 | 12/2009 | Benedict |
| 2010/0002402 A1 | 1/2010 | Rogers |
| 2010/0059863 A1 | 3/2010 | Rogers |
| 2010/0072577 A1 | 3/2010 | Nuzzo |
| 2010/0073669 A1 | 3/2010 | Colvin |
| 2010/0087782 A1 | 4/2010 | Ghaffari |
| 2010/0090781 A1 | 4/2010 | Yamamoto |
| 2010/0090824 A1 | 4/2010 | Rowell |
| 2010/0116526 A1 | 5/2010 | Arora |
| 2010/0117660 A1 | 5/2010 | Douglas |
| 2010/0164079 A1* | 7/2010 | Dekker ............... H01L 21/4846 257/676 |
| 2010/0178722 A1 | 7/2010 | De Graff |
| 2010/0245011 A1 | 9/2010 | Chatzopoulos |
| 2010/0264552 A1* | 10/2010 | Nakasato ............ H01L 21/6835 257/778 |
| 2010/0271191 A1 | 10/2010 | De Graff |
| 2010/0298895 A1 | 11/2010 | Ghaffari |
| 2010/0317132 A1 | 12/2010 | Rogers |
| 2010/0321161 A1 | 12/2010 | Isabell |
| 2010/0327387 A1 | 12/2010 | Kasai |
| 2011/0011179 A1 | 1/2011 | Gustafsson |
| 2011/0034912 A1 | 2/2011 | De Graff |
| 2011/0051384 A1 | 3/2011 | Kriechbaum |
| 2011/0054583 A1 | 3/2011 | Litt |
| 2011/0101789 A1 | 5/2011 | Salter |
| 2011/0121822 A1 | 5/2011 | Parsche |
| 2011/0140897 A1 | 6/2011 | Purks |
| 2011/0163345 A1* | 7/2011 | Fukunaga ............. H01L 21/565 257/98 |
| 2011/0168785 A1* | 7/2011 | Lin ......................... H01L 23/48 235/492 |
| 2011/0175735 A1 | 7/2011 | Forster |
| 2011/0184320 A1 | 7/2011 | Shipps |
| 2011/0210441 A1* | 9/2011 | Lee ..................... H01L 23/3128 257/737 |
| 2011/0215931 A1 | 9/2011 | Callsen |
| 2011/0218756 A1 | 9/2011 | Callsen |
| 2011/0218757 A1 | 9/2011 | Callsen |
| 2011/0220890 A1 | 9/2011 | Nuzzo |
| 2011/0275176 A1* | 11/2011 | Van Veen ............ H01L 25/0657 438/106 |
| 2011/0277813 A1 | 11/2011 | Rogers |
| 2011/0284268 A1 | 11/2011 | Palaniswamy |
| 2011/0306851 A1 | 12/2011 | Wang |
| 2012/0016258 A1 | 1/2012 | Webster |
| 2012/0051005 A1 | 3/2012 | Vanfleteren |
| 2012/0052268 A1 | 3/2012 | Axisa |
| 2012/0065937 A1 | 3/2012 | De Graff |
| 2012/0074546 A1 | 3/2012 | Chong |
| 2012/0087216 A1 | 4/2012 | Keung |
| 2012/0091594 A1 | 4/2012 | Landesberger |
| 2012/0092178 A1 | 4/2012 | Callsen |
| 2012/0092222 A1 | 4/2012 | Kato |
| 2012/0101413 A1 | 4/2012 | Beetel |
| 2012/0101538 A1 | 4/2012 | Ballakur |
| 2012/0108012 A1 | 5/2012 | Yasuda |
| 2012/0126418 A1 | 5/2012 | Feng |
| 2012/0157804 A1* | 6/2012 | Rogers ................. A61B 5/0422 600/345 |
| 2012/0172697 A1 | 7/2012 | Urman |
| 2012/0226130 A1 | 9/2012 | De Graff |
| 2012/0244848 A1 | 9/2012 | Ghaffari |
| 2012/0256308 A1 | 10/2012 | Helin |
| 2012/0261174 A1* | 10/2012 | Chuma .................... C08L 63/00 174/260 |
| 2012/0316455 A1 | 12/2012 | Rahman |
| 2012/0319268 A1* | 12/2012 | Kagimoto ............... B32B 15/08 257/734 |
| 2012/0327608 A1 | 12/2012 | Rogers |
| 2013/0041235 A1 | 2/2013 | Rogers |
| 2013/0099358 A1 | 4/2013 | Elolampi |
| 2013/0100618 A1 | 4/2013 | Rogers |
| 2013/0118255 A1 | 5/2013 | Callsen |
| 2013/0150693 A1 | 6/2013 | D'angelo |
| 2013/0176689 A1* | 7/2013 | Nishimura ............. H05K 3/284 361/739 |
| 2013/0185003 A1 | 7/2013 | Carbeck |
| 2013/0192356 A1 | 8/2013 | De Graff |
| 2013/0200268 A1 | 8/2013 | Rafferty |
| 2013/0211761 A1 | 8/2013 | Brandsma |
| 2013/0214300 A1 | 8/2013 | Lerman |
| 2013/0215467 A1 | 8/2013 | Fein |
| 2013/0225965 A1 | 8/2013 | Ghaffari |
| 2013/0237150 A1 | 9/2013 | Royston |
| 2013/0245388 A1 | 9/2013 | Rafferty |
| 2013/0274562 A1 | 10/2013 | Ghaffari |
| 2013/0313713 A1 | 11/2013 | Arora |
| 2013/0316442 A1 | 11/2013 | Meurville |
| 2013/0316487 A1 | 11/2013 | De Graff |
| 2013/0320503 A1 | 12/2013 | Nuzzo |
| 2013/0321373 A1 | 12/2013 | Yoshizumi |
| 2014/0001058 A1 | 1/2014 | Ghaffari |
| 2014/0012160 A1 | 1/2014 | Ghaffari |
| 2014/0012242 A1 | 1/2014 | Lee |
| 2014/0022746 A1 | 1/2014 | Hsu |
| 2014/0039290 A1 | 2/2014 | De Graff |
| 2014/0097944 A1 | 4/2014 | Fastert |

(56) References Cited

U.S. PATENT DOCUMENTS

| | | |
|---|---|---|
| 2014/0110859 A1 | 4/2014 | Rafferty |
| 2014/0140020 A1 | 5/2014 | Rogers |
| 2014/0188426 A1 | 7/2014 | Fastert |
| 2014/0191236 A1 | 7/2014 | Nuzzo |
| 2014/0216524 A1 | 8/2014 | Rogers |
| 2014/0240932 A1 | 8/2014 | Hsu |
| 2014/0249520 A1 | 9/2014 | Ghaffari |
| 2014/0303452 A1 | 10/2014 | Ghaffari |
| 2014/0340857 A1 | 11/2014 | Hsu |
| 2014/0374872 A1 | 12/2014 | Rogers |
| 2014/0375465 A1 | 12/2014 | Fenuccio |
| 2015/0001462 A1 | 1/2015 | Rogers |
| 2015/0019135 A1 | 1/2015 | Kacyvenski |
| 2015/0035680 A1 | 2/2015 | Li |
| 2015/0069617 A1 | 3/2015 | Arora |
| 2015/0099976 A1 | 4/2015 | Ghaffari |
| 2015/0100135 A1 | 4/2015 | Ives |
| 2015/0194817 A1 | 7/2015 | Lee |
| 2015/0237711 A1 | 8/2015 | Rogers |
| 2015/0241288 A1 | 8/2015 | Keen |
| 2015/0260713 A1 | 9/2015 | Ghaffari |
| 2015/0272652 A1 | 10/2015 | Ghaffari |
| 2015/0286913 A1 | 10/2015 | Fastert |
| 2015/0320472 A1 | 11/2015 | Ghaffari |
| 2015/0335254 A1 | 11/2015 | Elolampi |
| 2015/0342036 A1 | 11/2015 | Fastert |

FOREIGN PATENT DOCUMENTS

| | | |
|---|---|---|
| JP | 05-087511 A | 4/1993 |
| JP | 2009-170173 A | 7/2009 |
| WO | WO 1999/038211 A2 | 7/1999 |
| WO | WO 2005/122285 A2 | 12/2005 |
| WO | WO 2003/021679 A2 | 3/2006 |
| WO | WO 2007/003019 A2 | 1/2007 |
| WO | WO 2007/116344 A1 | 10/2007 |
| WO | WO 2007/136726 A2 | 11/2007 |
| WO | WO 2008/030960 A2 | 3/2008 |
| WO | WO 2009/111641 A1 | 9/2009 |
| WO | WO 2009/114689 A1 | 9/2009 |
| WO | WO 2010/036807 A1 | 4/2010 |
| WO | WO 2010/042653 A1 | 4/2010 |
| WO | WO 2010/042957 A2 | 4/2010 |
| WO | WO 2010/046883 A1 | 4/2010 |
| WO | WO 2010/056857 A2 | 5/2010 |
| WO | WO 2010/081137 A2 | 7/2010 |
| WO | WO 2010/082993 A2 | 7/2010 |
| WO | WO 2010/102310 A2 | 9/2010 |
| WO | WO 2010/132552 A1 | 11/2010 |
| WO | WO 2011/003181 A1 | 1/2011 |
| WO | WO 2011/041727 A1 | 4/2011 |
| WO | WO 2011/084450 A1 | 7/2011 |
| WO | WO 2011/084709 A2 | 7/2011 |
| WO | WO 2011/127331 A2 | 10/2011 |
| WO | WO 2012/125494 A2 | 9/2012 |
| WO | WO 2012/166686 A2 | 12/2012 |
| WO | WO 2013/010171 A1 | 1/2013 |
| WO | WO 2013/022853 A1 | 2/2013 |
| WO | WO 2013/033724 A1 | 3/2013 |
| WO | WO 2013/034987 A3 | 3/2013 |
| WO | WO 2013/049716 A1 | 4/2013 |
| WO | WO 2013/052919 A2 | 4/2013 |
| WO | WO 2013/170032 A2 | 11/2013 |
| WO | WO 2014/007871 A1 | 1/2014 |
| WO | WO 2014/058473 A1 | 4/2014 |
| WO | WO 2014/059032 A1 | 4/2014 |
| WO | WO 2014/106041 A1 | 7/2014 |
| WO | WO 2014/110176 A1 | 7/2014 |
| WO | WO 2014/130928 A2 | 8/2014 |
| WO | WO 2014/130931 A1 | 8/2014 |
| WO | WO 2014/186467 A2 | 11/2014 |
| WO | WO 2014/197443 A1 | 12/2014 |
| WO | WO 2014/205434 A2 | 12/2014 |
| WO | WO 2015/021039 A1 | 2/2015 |
| WO | WO 2015/054312 A1 | 4/2015 |
| WO | WO 2015/077559 A1 | 5/2015 |
| WO | WO 2015/080991 A1 | 6/2015 |
| WO | WO 2015/102951 A2 | 7/2015 |
| WO | WO 2015/103483 A1 | 7/2015 |
| WO | WO 2015/103580 A2 | 7/2015 |
| WO | WO 2015/127458 A1 | 8/2015 |
| WO | WO 2015/134588 A1 | 9/2015 |
| WO | WO 2015/138712 A1 | 9/2015 |

OTHER PUBLICATIONS

Demura et al., "Immobilization of Glucose Oxidase with *Bombyx mori* Silk Fibroin by Only Stretching Treatment and its Application to Glucose Sensor," Biotechnology and Bioengineering, vol. 33, 598-603 (6 pages) (1989).

Ellerbee et al., "Quantifying Colorimetric Assays in Paper-Based Microfluidic Devices by Measuring the Transmission of Light through Paper," Analytical Chemistry, vol. 81, No. 20 8447-8452, (6 pages) (Oct. 15, 2009).

Halsted, "Ligature and Suture Material," Journal of the American Medical Association, vol. LX, No. 15, 1119-1126, (8 pages) (Apr. 12, 1913).

Kim et al., "Complementary Metal Oxide Silicon Integrated Circuits Incorporating Monolithically Integrated Stretchable Wavy Interconnects," Applied Physics Letters, vol. 93, 044102-044102.3 (3 pages) (Jul. 31, 2008).

Kim et al., "Dissolvable Films of Silk Fibroin for Ultrathin Conformal Bio-Integrated Electronics," Nature, 1-8 (8 pages) (Apr. 18, 2010).

Kim et al., "Materials and Noncoplanar Mesh Designs for Integrated Circuits with Linear Elastic Responses to Extreme Mechanical Deformations," PNAS, vol. 105, No. 48, 18675-18680 (6 pages) (Dec. 2, 2008).

Kim et al., "Stretchable and Foldable Silicon Integrated Circuits," Science, vol. 320, 507-511 (5 pages) (Apr. 25, 2008).

Kim et al., "Electrowetting on Paper for Electronic Paper Display," ACS Applied Materials & Interfaces, vol. 2, No. 11, (3318-3323) (6 pages) (Nov. 24, 2010).

Ko et al., "A Hemispherical Electronic Eye Camera Based on Compressible Silicon Optoelectronics," Nature, vol. 454, 748-753 (6 pages) (Aug. 7, 2008).

Lawrence et al., "Bioactive Silk Protein Biomaterial Systems for Optical Devices," Biomacromolecules, vol. 9, 1214-1220 (7 pages) (Nov. 4, 2008).

Meitl et al., "Transfer Printing by Kinetic Control of Adhesion to an Elastomeric Stamp," Nature, vol. 5, 33-38 (6 pages) (Jan. 2006).

Omenetto et al., "A New Route for Silk," Nature Photonics, vol. 2, 641-643 (3 pages) (Nov. 2008).

Omenetto et al., "New Opportunities for an Ancient Material," Science, vol. 329, 528-531 (5 pages) (Jul. 30, 2010).

Siegel et al., "Foldable Printed Circuit Boards on Paper Substrates," Advanced Functional Materials, vol. 20, No. 1, 28-35, (8 pages) (Jan. 8, 2010).

Tsukada et al., "Structural Changes of Silk Fibroin Membranes Induced by Immersion in Methanol Aqueous Solutions," Journal of Polymer Science, vol. 32, 961-968 (8 pages) (1994).

Wang et al., "Controlled Release From Multilayer Silk Biomaterial Coatings to Modulate Vascular Cell Responses" Biomaterials, 29, 894-903 (10 pages) (Nov. 28, 2008).

International Search Report, PCT/US2015/053727, 2 pages (dated Dec. 22, 2015).

Written Opinion, PCT/US2015/053727, 6 pages (dated Dec. 22, 2015).

\* cited by examiner

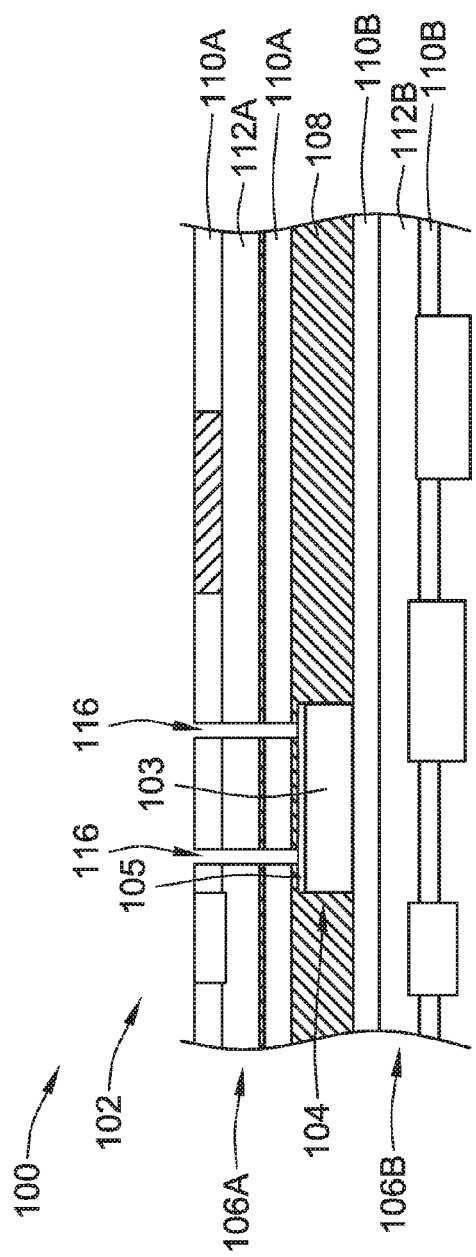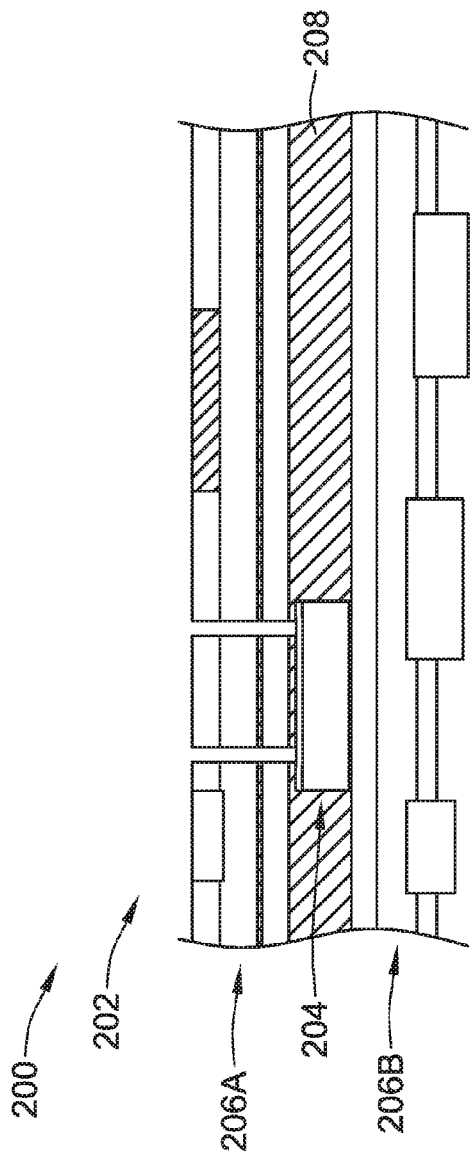

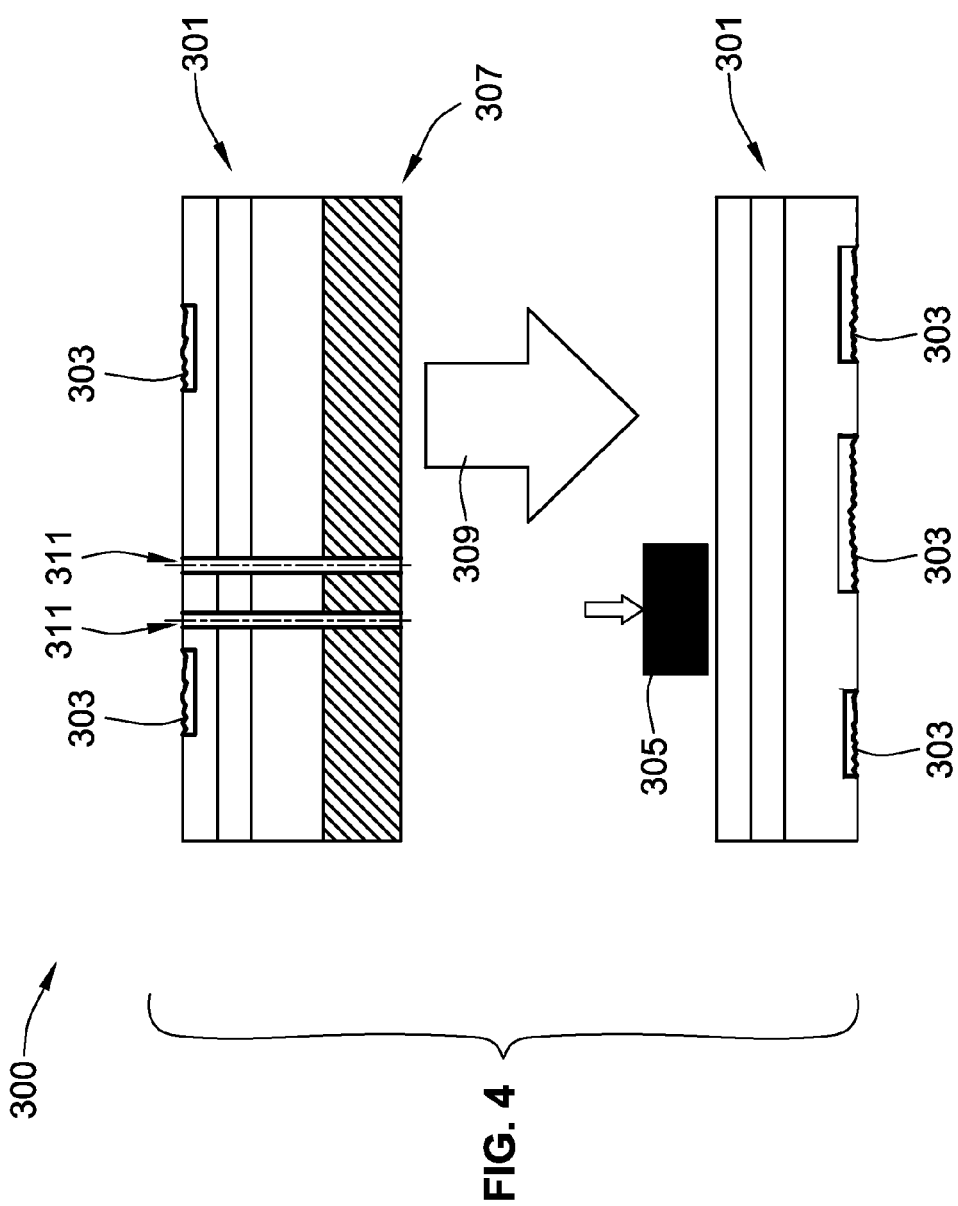

FLEXIBLE ELECTRONIC CIRCUITS WITH EMBEDDED INTEGRATED CIRCUIT DIE

CLAIM OF PRIORITY AND CROSS-REFERENCE TO RELATED APPLICATION

This application claims the benefit of priority to U.S. Provisional Patent Application No. 62/059,478, which was filed on Oct. 3, 2014, and is incorporated herein by reference in its entirety.

TECHNICAL FIELD

The present disclosure relates generally to printed circuit boards (PCB) and integrated circuits (IC). More particularly, aspects of this disclosure relate to flexible integrated circuitry with embedded IC die.

BACKGROUND

Integrated circuits (IC) are the cornerstone of the information age and the foundation of today's information technology industries. The integrated circuit, a.k.a. "chip" or "microchip," is a set of interconnected electronic components, such as transistors, capacitors, and resistors, which are etched or imprinted onto a tiny wafer of semiconducting material, such as silicon or germanium. Integrated circuits take on various forms including, as some non-limiting examples, microprocessors, amplifiers, Flash memories, application specific integrated circuits (ASICs), static random access memories (SRAMs), digital signal processors (DSPs), dynamic random access memories (DRAMs), erasable programmable read only memories (EPROMs), and programmable logic. Integrated circuits are used in innumerable products, including personal computers, laptop and tablet computers, smartphones, flat-screen televisions, medical instruments, telecommunication and networking equipment, airplanes, watercraft and automobiles.

Advances in integrated circuit technology and microchip manufacturing have led to a steady decrease in chip size and an increase in circuit density and circuit performance. The scale of semiconductor integration has advanced to the point where a single semiconductor chip can hold tens of millions to over a billion devices in a space smaller than a U.S. penny. Moreover, the width of each conducting line in a modern microchip can be made as small as a fraction of a nanometer. The operating speed and overall performance of a semiconductor chip (e.g., clock speed and signal net switching speeds) has concomitantly increased with the level of integration. To keep pace with increases in on-chip circuit switching frequency and circuit density, semiconductor packages currently offer higher pin counts, greater power dissipation, more protection, and higher speeds than packages of just a few years ago.

Conventional microchips are generally rigid structures that are not designed to be bent or stretched during normal operating conditions. In addition, most IC's are typically mounted on a printed circuit board (PCB) that is as thick or thicker than the IC and similarly rigid. Processes using thick and rigid printed circuit boards are generally incompatible for applications requiring stretchable or bendable circuitry. Consequently, many schemes have been proposed for embedding microchips on or in a flexible polymeric substrate. This, in turn, enables many useful device configurations not otherwise possible with rigid silicon-based electronic devices. However, many of these schemes are based on the assumption that the embedded chips are considerably thicker than the individual layers of flexible polymer that make up the PCBs. Such schemes are not compatible for "thin chip" configurations. In addition, available processes for making flexible circuits oftentimes require multiple layers of expensive materials, which not only increases material and manufacturing costs but also results in a composite structure that is undesirably thick.

SUMMARY

Disclosed herein are flexible electronic circuits with an embedded semiconductor die, including methods of making and methods of using the same. Embodiments of this disclosure are directed to embedding a silicon (Si) die (or other semiconductor dies, including those fabricated from gallium arsenide (GaAs) and those intended for photovoltaic applications) of an integrated circuit in a layer of thermoplastic polymer, polyimide adhesive, or other flexible polymeric adhesives. Aspects of this disclosure describe a stack of flexible substrate materials used in embedding a silicon IC chip directly into the substrate. Some configurations, for example, entrench the die in a layer of polyimide (PI) adhesive. Other configurations entrench the die in a layer of thermoplastic resin. For either of the foregoing examples, the substrate with embedded die can be sandwiched between multiple layers of thermoset polymer sheets with electrically conductive metallic coatings. Two sheets of double-sided copper clad polyimide film, for example, can surround the embedding substrate material. The result is a four-metal-layer flexible printed circuit board.

Aspects of the present disclosure are directed to a flexible integrated circuit (IC) module. The flexible IC module includes a flexible substrate with a semiconductor die attached to the flexible substrate. The flexible IC module also includes an encapsulating layer that is attached or coupled to the flexible substrate. The encapsulating layer includes a thermoplastic resin or a polyimide adhesive, or both, encasing therein the semiconductor die. The encapsulating layer may be an acrylic-based thermally conductive and electrically isolating polyimide adhesive. Optionally, the encapsulating layer may be a B-stage FR-4 glass-reinforced epoxy thermoplastic polymer, copolymer or blend. The die may be embedded between two flexible substrates, each of which includes a layer of flexible polymer, such as a polyimide sheet, with two layers of conductive material, such as copper cladding, on opposing sides of each layer of flexible polymer. Modules with greater or fewer layers are also envisioned as being within the scope and spirit of the present disclosure.

According to other aspects of the present disclosure, a flexible integrated circuit (IC) package for an extremely flexible electronic device is presented. The flexible IC module includes a first flexible substrate with a first layer of flexible polymer and a first pair of layers of conductive material. Each layer of conductive material is disposed on a respective side of the layer of flexible polymer. A silicon die is attached to the first flexible substrate. The silicon die includes a wafer of electronic-grade silicon with an integrated circuit formed thereon. The flexible IC module also includes a second flexible substrate with a second layer of flexible polymer and a second pair of layers of conductive material. Each layer of conductive material is disposed on a respective side of the flexible polymer. An encapsulating layer is disposed between and laminated to both the first and second flexible substrates. The encapsulating layer includes a thermoplastic resin or a polyimide adhesive, or both, encasing therein the silicon die.

Other aspects of the present disclosure are directed to methods for making and methods for using flexible integrated circuits. In one aspect, a method for assembling a flexible integrated circuit module is disclosed. The method includes: providing first and second flexible substrates, each of the flexible substrates including a respective layer of flexible polymer with two layers of conductive material each disposed on a respective side of the layer of flexible polymer; attaching a semiconductor die to the second flexible substrate; laminating an encapsulating layer to the first flexible substrate, the encapsulating layer including a thermoplastic resin or a polyimide adhesive, or both; and, laminating the encapsulating layer and the second flexible substrate to the first flexible substrate such that the thermoplastic resin or the polyimide adhesive, or both, flow around and encase therein the semiconductor die. By using a thermoplastic resin or a polyimide adhesive, the encapsulating layer can be heat-set laminated to one substrate and subsequently heat-set laminated to the another substrate without requiring an additional layer of adhesive material. This, in turn, reduces manufacturing and material costs, and helps to minimize the module thickness and overall volume.

The above summary is not intended to represent each embodiment or every aspect of the present disclosure. Rather, the foregoing summary merely provides an exemplification of some of the novel aspects and features set forth herein. The above features and advantages, and other features and advantages of the present disclosure, will be readily apparent from the following detailed description of representative embodiments and modes for carrying out the present invention when taken in connection with the accompanying drawings and the appended claims.

BRIEF DESCRIPTION OF THE DRAWINGS

FIG. 2 is a cross-sectional side-view illustration of a representative flexible electronic circuit with a multi-layer IC module in accord with aspects of the present disclosure.

FIG. 3 is a cross-sectional side-view illustration of another representative flexible electronic circuit system with a multi-layer IC module in accord with aspects of the present disclosure.

FIG. 4 is a workflow diagram illustrating a representative method for assembling a flexible circuit (IC) module in accord with aspects of the present disclosure.

Figure 1:
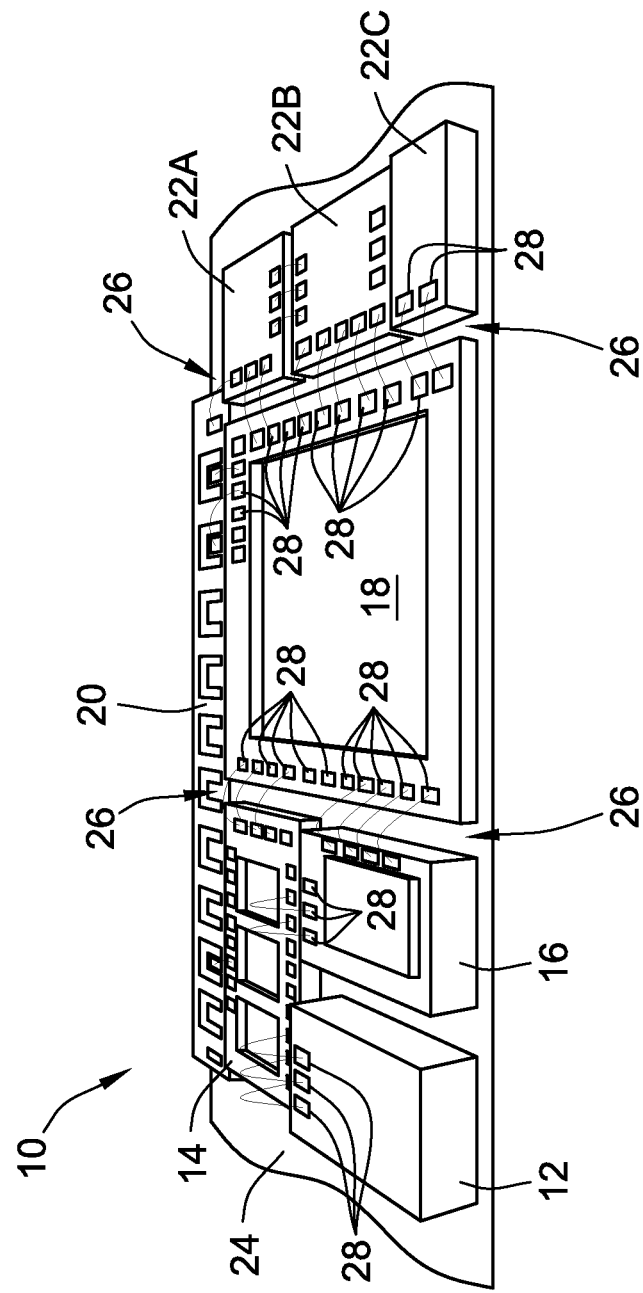
FIG. 1 is a perspective-view illustration of an example of a flexible electronic circuit system with integrated circuit (IC) packages connected by pliant wirebonded interconnects in accord with aspects of the present disclosure.

The present disclosure is susceptible to various modifications and alternative forms, and some representative embodiments have been shown by way of example in the drawings and will be described in detail herein. It should be understood, however, that the invention is not intended to be limited to the particular forms disclosed. Rather, the disclosure is to cover all modifications, equivalents, combinations, subcombinations, and alternatives falling within the spirit and scope of the invention as defined by the appended claims.

DETAILED DESCRIPTION OF THE ILLUSTRATED EMBODIMENTS

This disclosure is susceptible of embodiment in many different forms. There are shown in the drawings, and will herein be described in detail, representative embodiments with the understanding that the present disclosure is to be considered as an exemplification of the principles of the present disclosure and is not intended to limit the broad aspects of the disclosure to the embodiments illustrated. To that extent, elements and limitations that are disclosed, for example, in the Abstract, Summary, and Detailed Description sections, but not explicitly set forth in the claims, should not be incorporated into the claims, singly or collectively, by implication, inference or otherwise. For purposes of the present detailed description, unless specifically disclaimed or logically prohibited: the singular includes the plural and vice versa; and the word "including" or "comprising" or "having" means "including without limitation." Moreover, words of approximation, such as "about," "almost," "substantially," "approximately," and the like, can be used herein in the sense of "at, near, or nearly at," or "within 3-5% of," or "within acceptable manufacturing tolerances," or any logical combination thereof, for example.

The terms "flexible" and "stretchable" and "bendable," including roots and derivatives thereof, when used as an adjective to modify electrical circuitry, electrical systems, and electrical devices or apparatuses, are meant to encompass electronics that comprise at least some components having pliant or elastic properties such that the circuit is capable of being flexed, stretched and/or bent, respectively, without tearing or breaking or compromising their electrical characteristics. These terms are also meant to encompass circuitry having components (whether or not the components themselves are individually stretchable, flexible or bendable) that are configured in such a way so as to accommodate and remain functional when applied to a stretchable, bendable, inflatable, or otherwise pliant surface. In configurations deemed "extremely stretchable," the circuitry is capable of stretching and/or compressing and/or bending while withstanding high translational strains, such as in the range of −100% to 100% and, in some embodiments, up to −100,000% to +100,000%, and/or high rotational strains, such as to an extent of 180° or greater, without fracturing or breaking and while substantially maintaining electrical performance found in an unstrained state.

The discrete "islands" or "packages" mentioned herein are discrete operative devices, e.g., arranged in a "device island" arrangement, and are themselves capable of performing the functionality described herein, or portions thereof. Such functionality of the operative devices can include, for example, integrated circuits, physical sensors (e.g. temperature, pH, light, radiation, etc.), biological sensors, chemical sensors, amplifiers, A/D and D/A converters, optical collectors, electro-mechanical transducers, piezoelectric actuators, light emitting electronics (e.g., LEDs), and any combination thereof. A purpose and an advantage of using one or more standard ICs (e.g., CMOS on single crystal silicon) is to use high-quality, high-performance, and high-functioning circuit components that are readily accessible and mass-produced with well-known processes, and which provide a range of functionality and generation of data far superior to that produced by passive means. The discrete islands may range from about, but not limited to, 10-100 micrometers (µm) in size measured on an edge or by diameter.

Referring now to the drawings, wherein like reference numerals refer to like components throughout the several views, FIG. 1 illustrates an example of a flexible integrated circuit (IC) system, designated generally as 10, which may be adapted as or integrated into an "extremely stretchable" IC apparatus. Many of the disclosed concepts are discussed with reference to the representative systems depicted in the drawings; the systems illustrated herein, however, are provided merely as exemplary applications by which the various inventive aspects and features of this disclosure can be applied. Thus, the novel aspects and features of the present disclosure are not per se limited to the particular arrangements and components presented in the drawings. Moreover, only selected components of the system(s) have been shown and will be described in additional detail hereinbelow. Nevertheless, the systems and devices discussed herein can include numerous additional and alternative features, and other well-known peripheral components, for example, for carrying out the various methods and functions disclosed herein. Some of the illustrated components are optional and, thus, can be removed.

The flexible IC system 10 of FIG. 1 comprises various electronic components (collectively referred to as "circuitry"), such as a laminated battery 12, a set of microchips 14, a sensor 16, a sensor hub 18, antenna 20, and an assortment of integrated passive devices (IPD) 22A, 22B and 22C. The circuitry is applied, secured, embedded or otherwise affixed to substrate 24, which is flexible—e.g., stretchable, bendable and/or compressible—as described herein. As such, the substrate 24 can be made of a plastic material or an elastomeric material, or combinations thereof. Examples of suitable flexible elastomers for the IC substrate material include polymeric organosilicon compounds (commonly referred to as "silicones"), including Polydimethylsiloxane (PDMS). Other non-limiting examples of materials suitable for the substrate 24 include polyimide, photopatternable silicon, SU8 polymer, PDS polydustrene, parylene and its derivatives and copolymers (parylene-N), ultrahigh molecular weight polyethylene, polyether ether ketones (PEEK), polyurethanes, polylactic acid, polyglycolic acid, polymer composites, silicones/siloxanes, polytetrafluoroethylene, polyamic acid, polymethyl acrylate, and combinations thereof. The substrate 24 can take on any possible number of shapes, sizes, and configurations. In the illustrated example, the substrate is substantially flat and, in some embodiments, configured to be an elongated sheet or strip.

The circuitry of FIG. 1 comprises one or more sensors 16 (also termed "sensor devices") to detect any of various parameters. These parameters can include, in any combination, thermal parameters (e.g., temperature), optical parameters (e.g., infrared energy), electrochemical and biochemical parameters, such as pH, enzymatic activity, blood components (e.g., glucose), ion concentrations, and protein concentrations, electrical parameters (e.g., resistance, conductivity, impedance, etc.), acoustic parameters, tactile parameters (e.g., pressure, surface characteristics, or other topographic features), etc. In this regard, one or more of the sensors 16 may be a thermocouple, a silicon band gap temperature sensor, a thin-film resistance temperature device, an LED emitter, a photodetector, a piezoelectric sensor, an ultrasonic sensor, an ion sensitive field effect transistor, etc. For some implementations, one or more of the sensors 16 can be coupled to a differential amplifier and/or a buffer and/or an analog to digital converter. The sensor hub 18, which may be in the nature of a microcontroller or digital signal processor (DSP), operates to integrate data signals from the sensor(s) 16 and process such signals. Signals from the sensor(s) 16 can be processed using multiplexing techniques, and can be switched into and processed by one or a few amplifier/logic circuits, including one or more of the microchips 14.

Battery 12 acts as a power source to supply power to the circuitry in the flexible IC system 10 of FIG. 1. Any suitable battery which is small in size and has a sufficiently long life with a suitable amp-hour capacity may be employed. It is also within the scope of this disclosure to employ alternative means for powering the system 10, including external power supplies. According to some embodiments, the flexible IC system 10 also includes a data transmission facility with an RF antenna 20 to wirelessly communicate with external devices. The antenna 20 can take on various forms, including a printed trace antenna coil with vias, which may be operable as a low frequency, high frequency or ultra-high frequency antenna. Other forms of wired and wireless signal transmission are also within the scope of this disclosure. Each integrated passive device (IPD) 22A-22C may comprise, as some non-limiting examples, a filter, a transformer, a photodiode, LED, TUFT, electrode, semiconductor, duplexer, coupler, phase shifter, thin-film device, circuit element, control elements, microprocessor, capacitors, resistors, inductors, buffer or other passive component.

For embodiments where the substrate 24 is stretchable or compressible, the illustrated circuitry is configured in applicable manners, such as those described herein, to be stretchable or compressible and/or to accommodate such stretching/compressing of the substrate 24. Similarly, for embodiments where the substrate 24 is bendable, but not necessarily stretchable, the illustrated circuitry is configured in applicable manners, such as those described herein, to be bendable and/or accommodate such bending of the substrate. For example, each of the illustrated modules or "islands" is connected to one or more adjacent modules with flexible wirebonded interconnects, some of which are designated generally as 26 in FIG. 1. The connection point of the individual interconnects to a device island may be anywhere along the device island edge, or may be at a point on the top surface of the device island (i.e., the surface opposite the substrate 24). The bond wires 26 are attached to externally mounted bond pads 28 on the modules and extend to a corresponding externally mounted bond pad 28 on an adjacent module. The bond wires can be attached through any known wirebonding technique, such as: ultrasonic bonding which uses a combination of pressure and ultrasonic vibration bursts to form a metallurgical cold weld; thermocompression bonding which uses a combination of pressure and elevated temperature to form a weld; and thermosonic bonding which uses a combination of pressure, elevated temperature, and ultrasonic vibration bursts to form a weld joint.

Turning next to FIG. 2, there is shown a cross-sectional illustration of a representative flexible electronic circuit system, designated generally as 100, with one or more multi-layer IC modules. While differing in appearance, the flexible IC system 100 of FIG. 2 can take on any of the various forms, optional configurations, and functional alternatives described herein with respect to the examples shown in FIGS. 1 and 3, and thus can include any of the corresponding options and features. Like the system 10 of FIG. 1, for example, the system 100 of FIG. 2 may be configured as an ultrathin, extremely stretchable integrated circuit system. Moreover, system 100 may comprise an assortment of discrete devices—one of which is represented in FIG. 2 by a flexible IC module 102—that are arranged in a "device island" arrangement and electrically coupled, for example, by pliant electrical interconnects. It is contemplated that the system 100 comprise greater or fewer than the number of discrete devices shown in the drawings, each of which may take on alternative forms and configurations.

In the embodiment of FIG. 2, the IC module 102 includes, but is not necessarily limited to, a flexible multi-layer integrated circuit (IC) package or "stack" capable of performing one or more of the functions described herein. The module 102 includes at least one semiconductor die 104 that is seated between at least two flexible substrates 106A and 106B. As shown, the semiconductor die 104 (also referred to herein as "silicon die") comprises a wafer of electronic-grade silicon 103 with an integrated circuit (or microchip) 105 formed thereon (e.g., via photolithography or any other known and industry accepted techniques). For some embodiments, the semiconductor die 104 is adhered directly to the second flexible substrate 106B. The microchip 105 may be a "thin chip" configuration with a thickness of about 2-7 μm or, in some embodiments, a thickness of about 5-7 μm or, in some embodiments, a thickness of about 3-5 μm or, in some embodiments, a thickness of about 2-3 μm. By comparison, the semiconductor die 104 has a thickness of approximately 10-50 μm or, in some embodiments, a thickness of approximately 35-50 μm or, in some embodiments, a thickness of approximately 15-25 μm or, in some embodiments, a thickness of approximately 10-15 μm, for example. In the representative systems, methods and devices described herein, each thin chip can be one or more passive electronic devices and/or one or more active electronic devices. Non-limiting examples of devices that can be embedded according to any of the principles described herein include an amplifier, a transistor, a photodiode array, a photodetector, a sensor, a light-emitting device, a photovoltaic device, a semiconductor laser array, an optical imaging device, a logic gate array, a microprocessor, an optoelectronic device, a microelectromechanical device, a microfluidic device, a nanoelectromechanical device, a thermal device, or other device structures.

Silicon die 104 is shown in FIG. 2 sandwiched between first and second flexible substrates 106A, 106B, each of which comprises one or more flexible polymeric layers interposed with one or more flexible electrically conductive layers. As shown, the first flexible substrate 106A includes two (first) layers of conductive material 110A, each disposed on a respective side of a (first) layer of flexible polymer 112A. Likewise, the second flexible substrate 106B includes two (second) layers of conductive material 110B, each disposed on a respective side of a (second) layer of flexible polymer 112B. The layers of flexible polymer 112A, 112B may be fabricated as sheets of thermoset polyimide polymer, while the layers of conductive material 110A, 110B may be fabricated as metallic sheets or coatings. In one specific implementation, the flexible polymer layers 112A, 112B are fabricated from a liquid crystal polymer or a polyimide polymer, such as KAPTON® film available from DuPont™ Alternatively, the flexible polymer layers 112A, 112B may be fabricated from any of the materials described above with respect to the substrate 24 of FIG. 1 or other materials suitable for flexible electronic circuitry. The polymeric layers 112A, 112B can each have a thickness of about 7 μm to about 85 μm or, in some embodiments, about 60 μm to about 85 μm or, in some embodiments, about 25 μm to about 50 μm or, in some embodiments, about 7 μm to about 10 μm. It is envisioned that the module 102 comprise greater or fewer layers than that shown in FIG. 2 of the drawings.

First and second electrically conductive (polymeric or metallic) layers 110A, 110B are disposed on opposing sides of the flexible polymeric layers 112A, 112B, as seen in FIG. 2. In an example, layers of copper cladding are applied, e.g., via electroplating, bonding, or other known cladding techniques, to opposing sides of elongated and flat polyimide sheets. The sheets of double-sided copper clad polyimide can subsequently be patterned with circuitry using ablation, etching or other similar patterning processes. Each electrically conductive layer 110A, 110B can have a thickness of about 5 μm to about 20 μm or, in some embodiments, a thickness of about 15 μm to about 20 μm or, in some embodiments, a thickness of about 10 μm to about 12 μm or, in some embodiments, a thickness of about 5 μm to about 8 Electrically conductive layers can also be fabricated, for example, from other metallic materials, including aluminum or a combination of copper and aluminum, as well as non-metallic materials.

An encapsulating layer 108 is disposed between and attached or coupled to the two flexible substrates 106A, 106B of FIG. 2. Encapsulating layer 108 may be a polyimide (PI) adhesive which covers the semiconductor die 104 such that the die 104 is encased between the flexible substrate 106B and the encapsulating layer 108. For some embodiments, the encapsulating layer 108 is an acrylic-based thermally conductive and electrically isolating polyimide adhesive that is first laminated onto one flexible substrate 106B, flowing over and surrounding die 104, and subsequently laminated to another substrate 106A to form the multi-layer stack. The encapsulating layer 108 can have a thickness of about 15 μm to about 65 μm or, in some embodiments, about 20 μm to about 55 μm or, in some embodiments, about 25 μm to about 50 Encapsulating layer 108 can be a conductive adhesive or a non-conductive (dielectric) adhesive that is configured to withstand the temperatures of assembly and processing. In some optional and alternative configurations, encapsulating layer 108 can be a fluropolymer adhesive, a polyimide blend adhesive, an epoxy adhesive, or an acrylic adhesive, such as PYRALUX® Bond-Ply available from DuPont™, or any combination thereof.

Polyimide adhesive is a non-metallic organic adhesive capable of bonding composite laminates and a wide variety of high temperature metallic substrates, such as copper, stainless steel and titanium, while maintaining thermal oxidative stability, high service temperature performance (e.g., 575° F.+), moisture resistance and environmental durability. Unlike many other available adhesive compositions suitable for integrated circuit applications, PI adhesives can be laminated and re-laminated without compromising the structural integrity of the resultant bond. By using a polyimide adhesive or a thermoplastic resin (discussed below in FIG. 3), the encapsulating layer can be heat-set laminated to one substrate and subsequently heat-set laminated to another substrate without requiring any additional layers of adhesive material. This, in turn, reduces manufacturing and material costs, and also helps minimize the module's thickness and overall volume.

One or more vias can be generated as channels, e.g., with a laser drill, extending through outer layers of the flexible IC package to allow for conductive connections between different layers of the multi-layer stack. In FIG. 2, for example, the flexible IC module 102 includes a pair of vias 116 that extend through the top layers of the module 102 (e.g., the three-layer substrate 106A) to the microchip 105. Once these vias 116 have been created, the vias 116 can be electroplated or filled through sputtering or other known technique to create electrical connections from the top conductive layer 110A to one or more electrical contact pads of the die. The conductive layers can then be patterned and an overlay can be applied to the outer surface of each conductive layer. In some implementations, the overlay is a non-conductive polymer.

It is contemplated that the illustrated multi-layer IC package comprises additional or fewer layers than the sandwich constructions shown in FIG. 2. It should also be noted that the use of the term "layer" in the description and claims does not necessarily require that particular segment of the sandwich construction be continuous or span the entirety of (i.e., be coextensive with) all remaining layers unless otherwise explicitly stated in the claims. While preferable in some applications, it is not necessary in practice that the layers of one flexible substrate be fabricated from the same materials as the layers of the other flexible substrate. It may be desirable, for some implementations, that the multi-layer package be vacuum laminated as a discrete, unitary structure prior to electrical coupling with one or more adjacent devices.

FIG. 3 illustrates another representative flexible electronic circuit system, designated generally as 200, with one or more multi-layer IC modules. Like reference numerals are used in FIG. 3 to indicate similar structure from FIG. 2. For example, the system 200 of FIG. 3 may comprise an assortment of discrete devices, including a flexible IC module 202, which are arranged in a "device island" arrangement and electrically coupled, for example, by pliant electrical interconnects. Moreover, the flexible IC system 200 can take on any of the various forms, optional configurations, and functional alternatives described herein with respect to the other examples shown in the figures, and vice versa, unless explicitly or logically prohibited.

Similar to the example illustrated in FIG. 2, the IC module 202 of FIG. 3 includes a flexible multi-layer integrated circuit (IC) package with at least one semiconductor die 204 that is seated between at least two flexible substrates 206A and 206B. For some embodiments, the semiconductor die 204 is adhered directly to the second flexible substrate 206B. Each of the first and second flexible substrates 206A, 206B comprises one or more flexible polymeric layers interposed with one or more flexible electrically conductive layers. While not per se required to practice the inventive aspects disclosed herein, the semiconductor die 204 and flexible substrates 206A, 206B of FIG. 3 may be structurally and functionally identical to their counterparts illustrated in FIG. 2; as such, for brevity and conciseness, a duplicated description of these elements will be omitted.

An encapsulating layer 208 is disposed between and attached to the two flexible substrates 206A, 206B of FIG. 3. In addition to or in lieu of the polyimide adhesive described in FIG. 2, the encapsulating layer 208 of FIG. 3 may be a thermoplastic polymer, copolymer or polymer blend (collectively referred to therein as "thermoplastic resin") which covers the semiconductor die 204 such that the die 204 is encased between the flexible substrate 206B and the encapsulating layer 208. For some embodiments, the encapsulating layer 208 is a B-stage FR-4 glass-reinforced epoxy thermoplastic polymer or copolymer or blend that is first laminated onto one flexible substrate 206B, flowing over and surrounding die 204, and subsequently laminated to another substrate 206A to form the multi-layer stack. In some non-limiting examples, the thermoplastic based resins include polycarbonate (PC), polyethylene (PET), and polyurethane (PU), and any composites or copolymer blends of these materials. A copolymer blend can include a polyimide layer on one of these thermoplastic polymers. The encapsulating layer 208 can have a thickness of about 15 μm to about 65 μm or, in some embodiments, about 20 μm to about 55 μm or, in some embodiments, about 25 μm to about 50 μm.

A functional advantage of using a thermoplastic core over a thermoset core to encase the die(s) is that thermoplastic polymers can be melted and re-melted back into a plasticized or liquid state, whereas thermoset plastics remain in a permanent solid state. Thermoplastics soften when heated and become more fluid as additional heat is applied; the curing process is reversible as no chemical bonding takes place. This characteristic allows thermoplastics to be reheated and remolded without negatively affecting the material's physical properties. There are multiple thermoplastic resins that offer various performance benefits, but most materials commonly offer high strength, shrink-resistance and easy bendability.

Also disclosed herein are methods for manufacturing flexible integrated circuits. These methods will be described with reference to the various configurations and features shown in FIGS. 1 through 3 of the drawings; such reference is being provided purely by way of explanation and clarification. In an example, a method 300 is illustrated in FIG. 4 as comprising, first, providing first and second flexible substrates (e.g., substrates 106A, B of FIG. 2 or substrates 206A, B of FIG. 3) at step 301. As indicated above, each substrate may include a layer of flexible polymer (e.g., flexible polymer layers 112A, B of FIG. 2) with a layer of conductive material (e.g., conductive material layers 110A, B of FIG. 2) disposed on each side of the flexible polymer layer. As indicated above, the flexible substrates may comprise sheets of double sided copper-clad polyimide film. The method 300 may then require, at step 303, patterning circuitry on both substrates.

At step 305, a silicon-based semiconductor die (e.g., semiconductor dies 104 and 204 of FIGS. 2 and 3) is then placed directly on one flexible substrate (e.g., the second flexible substrate 106B or 206B of FIGS. 2 and 3) and attached or coupled thereto, e.g., by non-conditioned epoxy, directly to an outer metal layer thereof. As seen in FIG. 4, the method 300 thereafter includes at step 307 laminating an encapsulating layer (e.g., a PI adhesive or a thermoplastic resin) to the other flexible substrate (e.g., the first flexible substrate 106A or 206A of FIGS. 2 and 3). At step 3-9, the flexible substrate with encapsulating layer are then laminated to the other flexible substrate with silicon die such that the thermoplastic resin and/or polyimide adhesive of the encapsulating layer flow around and encase the semiconductor die. At step 311, one or more vias may then be drilled or otherwise formed through the second flexible substrate and the encapsulating layer to contacts on the semiconductor die. The method 300 may then include electroplating the vias to connect the first flexible substrate to the semiconductor die. Additional circuit patterning may then be performed, and a protective solder mask applied to the outer surfaces of the stack.

In some embodiments, the aforementioned method includes at least those steps enumerated above. It is also within the scope and spirit of the present disclosure to omit steps, include additional steps, and/or modify the order presented herein. It should be further noted that each of the foregoing methods can be representative of a single sequence of related steps; however, it is expected that each of these method will be practiced in a systematic and repetitive manner.

The present disclosure is not limited to the precise construction and compositions disclosed herein; any and all modifications, changes, and variations apparent from the foregoing descriptions are within the spirit and scope of the disclosure as defined in the appended claims. Moreover, the present concepts expressly include any and all combinations and subcombinations of the preceding elements and aspects.

What is claimed:

1. A flexible integrated circuit (IC) module comprising:
a flexible substrate;
a semiconductor die attached to the flexible substrate; and
an encapsulating layer attached to the flexible substrate, the semiconductor die being encased between the flexible substrate and the encapsulating layer, the encapsulating layer including a polyimide adhesive, wherein the polyimide adhesive comprises an acrylic-based thermally conductive and electrically isolating polyimide adhesive.

2. The flexible integrated circuit module of claim 1, wherein the encapsulating layer further includes a thermoplastic resin.

3. The flexible integrated circuit module of claim 2, wherein the thermoplastic resin comprises a B-stage FR-4 glass-reinforced epoxy thermoplastic polymer or copolymer or blend.

4. The flexible integrated circuit module of claim 1, wherein the flexible substrate comprises a layer of flexible polymer and two layers of conductive material, each of the layers of conductive material being disposed on a respective side of the layer of flexible polymer.

5. The flexible integrated circuit module of claim 4, further comprising a second flexible substrate attached to the encapsulating layer on the opposite side of the flexible substrate, the second flexible substrate including one or more vias extending therethrough to the semiconductor die.

6. A flexible integrated circuit (IC) module comprising:
a flexible substrate;
a semiconductor die attached to the flexible substrate; and
an encapsulating layer attached to the flexible substrate, the encapsulating layer including a thermoplastic resin or a polyimide adhesive, or both, the semiconductor die being encased between the flexible substrate and the encapsulating layer,
wherein the thermoplastic resin comprises a B-stage FR-4 glass-reinforced epoxy thermoplastic polymer or copolymer or blend.

7. The flexible integrated circuit module of claim 6, wherein the polyimide adhesive comprises an acrylic-based thermally conductive and electrically isolating polyimide adhesive.

8. The flexible integrated circuit module of claim 6, wherein the semiconductor die comprises a wafer of electronic-grade silicon with an integrated circuit formed thereon.

9. The flexible integrated circuit module of claim 6, wherein the flexible substrate comprises a layer of flexible polymer and two layers of conductive material, each of the layers of conductive material being disposed on a respective side of the layer of flexible polymer.

10. The flexible integrated circuit module of claim 9, further comprising a second flexible substrate attached to the encapsulating layer on the opposite side of the flexible substrate, the second flexible substrate including one or more vias extending therethrough to the semiconductor die.

11. A flexible integrated circuit (IC) module comprising:
a flexible substrate;
a semiconductor die attached to the flexible substrate, the semiconductor die comprising a wafer of electronic-grade silicon with an integrated circuit formed thereon, and
an encapsulating layer attached to the flexible substrate, the semiconductor die being encased between the flexible substrate and the encapsulating layer, the encapsulating layer including a polyimide adhesive.

12. A flexible integrated circuit (IC) module comprising:
a flexible substrate including a layer of flexible polymer and two layers of conductive material, each of the layers of conductive material being disposed on a respective side of the layer of flexible polymer;
a semiconductor die attached to the flexible substrate; and
an encapsulating layer attached to the flexible substrate, the encapsulating layer including a thermoplastic resin or a polyimide adhesive, or both, the semiconductor die being encased between the flexible substrate and the encapsulating layer.

13. The flexible integrated circuit module of claim 12, wherein the layer of flexible polymer comprises a sheet of thermoset polyimide polymer, and the layers of conductive material each comprises a copper coating.

14. The flexible integrated circuit module of claim 13, wherein the layers of copper coating are each patterned on a respective side of the sheet of thermoset polyimide polymer.

15. The flexible integrated circuit module of claim 12, further comprising a second flexible substrate attached to the encapsulating layer on the opposite side of the flexible substrate.

16. The flexible integrated circuit module of claim 15, wherein the second flexible substrate comprises a second layer of flexible polymer and two second layers of conductive material, each of the second layers of conductive material being disposed on a respective side of the second layer of flexible polymer.

17. The flexible integrated circuit module of claim 16, wherein the second layer of flexible polymer comprises a sheet of thermoset polyimide polymer, and the second layers of conductive material each comprises a copper coating.

18. The flexible integrated circuit module of claim 15, wherein the second flexible substrate further comprises one or more vias extending therethrough to the semiconductor die.

19. The flexible integrated circuit module of claim 12, wherein the thermoplastic resin comprises a B-stage FR-4 glass-reinforced epoxy thermoplastic polymer or copolymer or blend and wherein the polyimide adhesive comprises an acrylic-based thermally conductive and electrically isolating polyimide adhesive.

20. The flexible integrated circuit module of claim 12, wherein the semiconductor die comprises a wafer of electronic-grade silicon with an integrated circuit formed thereon.

21. A flexible integrated circuit (IC) package for an extremely flexible electronic device, the flexible IC package comprising:
a first flexible substrate including a first layer of flexible polymer and a first pair of layers of conductive material, each of the first layers of conductive material being disposed on a respective side of the first layer of flexible polymer;
a silicon die attached to the first flexible substrate, the silicon die including a wafer of electronic-grade silicon with an integrated circuit formed thereon;
a second flexible substrate including a second layer of flexible polymer and a second pair of layers of conductive material, each of the second layers of conductive material being disposed on a respective side of the second layer of flexible polymer; and
an encapsulating layer disposed between and laminated to the first and second flexible substrates, the encapsulating layer including a thermoplastic resin or a polyimide adhesive, or both, encasing the silicon die.

22. The flexible integrated circuit package of claim 21, wherein the polyimide adhesive comprises an acrylic-based thermally conductive and electrically isolating polyimide adhesive.

23. The flexible integrated circuit package of claim 21, wherein the thermoplastic resin comprises a B-stage FR-4 glass-reinforced epoxy thermoplastic polymer or copolymer or blend.

24. The flexible integrated circuit package of claim 21, wherein the second flexible substrate further comprises one or more vias extending therethrough to the silicon die.

\* \* \* \* \*